United States Patent [19]

Shimabara et al.

[11] Patent Number: 5,510,958
[45] Date of Patent: Apr. 23, 1996

[54] ELECTRONIC CIRCUIT MODULE HAVING IMPROVED COOLING ARRANGEMENT

[75] Inventors: Norio Shimabara; Teruhiko Tokumo, both of Tokyo, Japan

[73] Assignee: Yokogawa Electric Corporation, Tokyo, Japan

[21] Appl. No.: 349,668

[22] Filed: Dec. 5, 1994

[30] Foreign Application Priority Data

Jan. 11, 1994 [JP] Japan .................... 6-001080

[51] Int. Cl.⁶ .................................................. H05K 7/20
[52] U.S. Cl. .................... 361/719; 257/714; 361/699; 361/789; 439/66
[58] Field of Search .................. 62/259.2; 165/104.33, 165/80.3, 80.4, 185; 439/66, 91, 485; 257/692, 693, 705, 706, 712–714; 174/15.1; 361/689, 699, 702, 704, 705, 761, 717–719, 760, 767, 772, 789

[56] References Cited

U.S. PATENT DOCUMENTS

| | | | |
|---|---|---|---|
| 4,109,378 | 8/1978 | Davies | 29/629 |
| 4,203,203 | 5/1980 | Gilissen | 29/846 |
| 5,155,661 | 10/1992 | Nagesh | 361/386 |
| 5,297,006 | 3/1994 | Mizukoshi | 361/704 |
| 5,331,510 | 7/1994 | Ouchi | 361/719 |
| 5,353,191 | 10/1994 | Volz | 361/690 |

*Primary Examiner*—Gerald P. Tolin
*Attorney, Agent, or Firm*—Moonray Kojima

[57] ABSTRACT

An electronic circuit module, having a small total thickness and excellent heat dissipation efficiency, and comprising insulating containers for holding electronic components therein and arranged between a thin metal board and a printed circuit board; surface contact connectors mounted between first planar surface contact terminals formed in the containers, and second planar surface contact formed on the printed circuit board, to make electrical connections therebetween; and securing means for securing the surface contact connectors to the metal board so that the connectors are lightly pressed between each container and printed circuit board. Pipes are disposed in the metal board for carrying coolant therein. Thus, heat generated by the electronic components is conveyed to the board via the containers, and hence to the outside for dissipation. The foregoing structure is advantageous in reducing the thickness of the module substantially, and in increasing the heat dissipation efficiency.

4 Claims, 4 Drawing Sheets 5,510,958

ELECTRONIC CIRCUIT MODULE HAVING IMPROVED COOLING ARRANGEMENT

BACKGROUND OF THE INVENTION

1. Field of Invention

This invention relates to an electronic circuit module using electronic components which generate heat; and, more particularly, to an electronic circuit module adapted to be installed in the head portion of an LSI tester, or in an aircraft.

2. Description of the Prior Art

Semiconductor devices, such as LSIs, are evolving at a rapid pace, and their various functions and constructions have become increasingly complex. An LSI tester is used to test such semiconductor devices.

An LSI tester first applies a testing signal having various patterns to an LSI or device under test (called "DIRT") from a testing signal means. The tester then compares output data from the DUT with an expected value pattern which has been previously prepared according to the applied testing signal. In this manner, the acceptability of the DUT is judged. As the number of pins of the DUT increases, electronic circuits, called "numerous pin electronics" are installed in the head portion of the tester which applies the testing signal to the DUT. An electronic circuit module, on which the numerous pin electronics are installed, is required to be as thin as possible.

A similar requirement is imposed on electronic circuit modules which are used in aircrafts, where weights and sizes of components are important.

FIG. 1 is a conceptual illustration of a conventional electronic module which is used in an aircraft or in the head portion of an LSI tester. The module comprises a plurality of electronic components which generate heat.

In FIG. 1, a plurality of electronic components P3 are packed on a printed circuit board P1. Similarly, a plurality of electronic components are packed on another printed circuit board P2. Thin metal sheets P4 are placed in intimate contact with the printed circuit boards P1 and P2 (on side so that no label appears in the drawing), respectively. Cooling fins P5 are shaped to have corrugated cross sections, as depicted. The cooling fins are disposed between the two thin metal sheets P4 and brazed or adhesively bonded to their respective thin metal sheets. A spacer is positioned between the two printed circuit boards. A connector P7 is mounted at one end surface of the printed circuit board P1.

Cooling air is supplied Into passages formed by the cooling fins P5 of corrugated cross section, as well as into passages formed between each cooling fin P5 and the spacer P6, to dissipate heat generated by the printed circuit boards and also by the electronic components.

To increase the efficiency of heat dissipation, the surface area of the cooling fins must be increased. But, the spacing between the two boards P1 and P2 of FIG. 1, must be of a certain dimension. Thus, it is nearly impossible with the conventional device to reduce the thickness of the module in the thickness direction. This presents serious problems, especially where a large number of printed circuit boards are arranged in a restricted space, such as available in head of an LSI tester, for example.

SUMMARY OF THE INVENTION

Accordingly, an object of the invention is to provide an electronic module which has a small total thickness, as measured in the direction of the printed circuit boards, and which has excellent heat dissipation efficiency.

DESCRIPTION OF THE PREFERRED EMBODIMENTS

Figure 1:
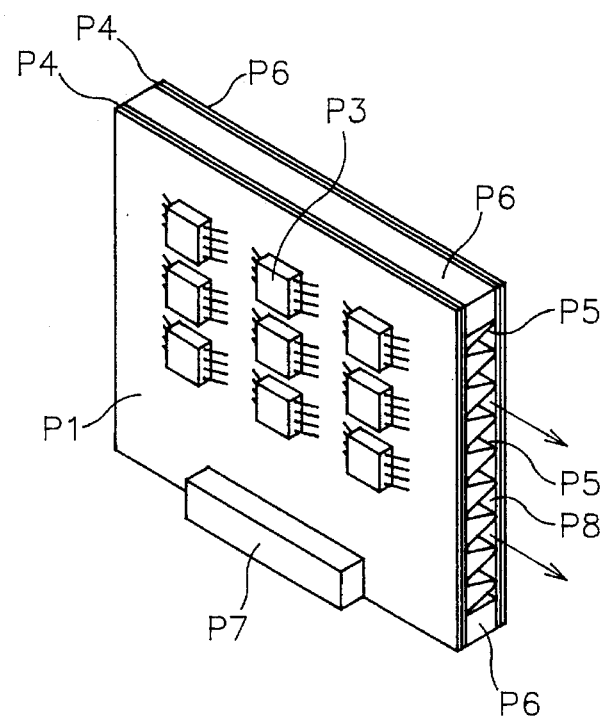
FIG. 1 is a perspective view of a conventional electronic circuit module.
Figure 2:
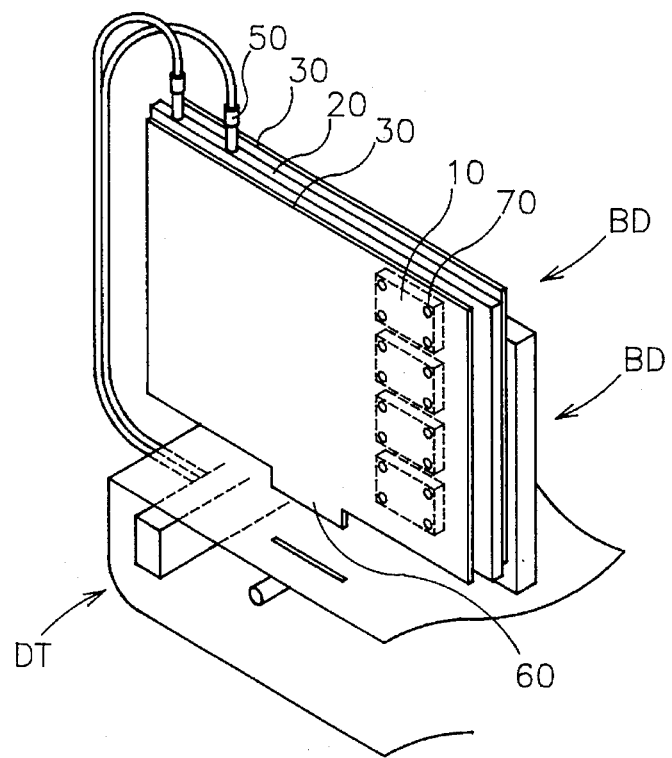
FIG. 2 is a perspective view of an illustrative embodiment of the invention, as used in the head portion of an LSI tester.

FIG. 2 shows an electronic circuit module according to the invention and as mounted in the head portion of an LSI tester. The head portion has a cylindrical shape. Although only one board BD, forming one electronic circuit module, is shown in this figure, a plurality of such boards may be arranged radially in the cylindrical tester head portion in practice. A plurality of boards may be closely spaced from each other near the center of the head portion of the tester. Thus, it is important that each Board be made as thin as possible.

A duct DT is mounted under the tester head portion. Tubes, through which coolant or cooling water is circulated, and signal lines, for interconnecting the boards, are disposed inside duct DT.

Boards BD comprises a thin metal board 20, two printed circuit boards 30 mounted on the opposite surfaces of the metal boards 20 extending in a parallel relation to each other, and a plurality of insulating containers 10 for holding electronic components. Containers 10 are mounted between the metal board 20 and each printed circuit board 30. Liquid coupling portions 50, permitting the coolant to be forced into the tubes located inside board BD, are mounted at one end surface of the board BD. A connector 60, for making electrical connections, is mounted at the other end surface. Screws 70, acting as securing means, secure the printed circuit boards 30 to the thin metal board 20 via the insulating containers 10. In this embodiment, liquid coupling portions 50 are mounted on the opposite side of board BD from connector 60. In particular, when board BD is mounted inside the tester head portion, liquid coupling portions 50 are mounted on the top end surface of the board to facilitate servicing of liquid coupling portions 50, from above. It is also possible to mount the liquid coupling portions 50 and connector 60 at the same end surface as board BD.

Figure 3:
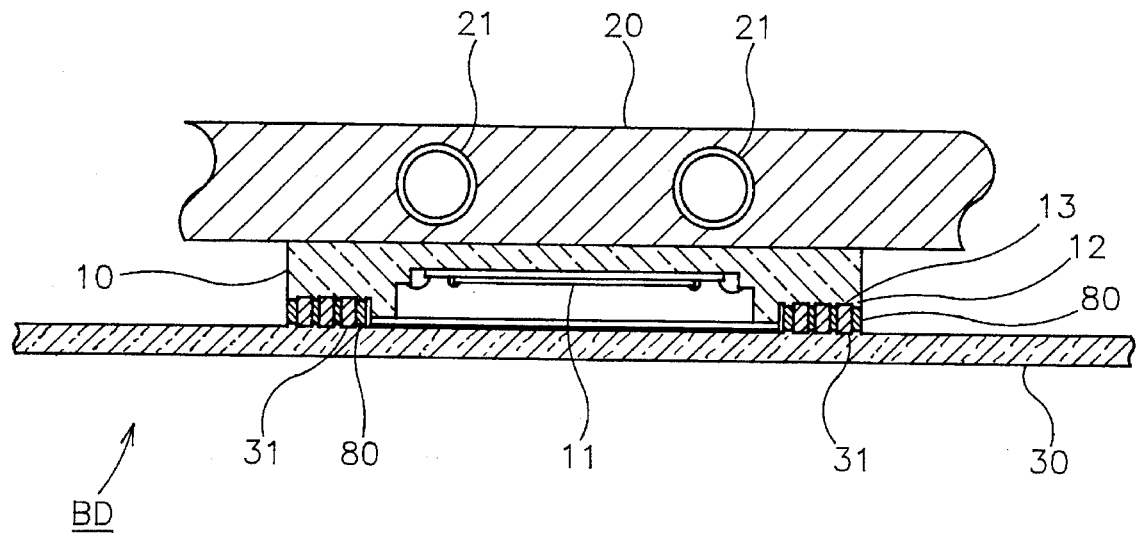
FIG. 3 is a fragmentary cross section of a board used as a component in the embodiment of FIG. 2.

FIG. 3 is a fragmentary cross section of one board forming an electronic circuit module embodying the concepts of the invention. In this example, a printed circuit board 30 is disposed on only one surface of a thin metal board 20 in a parallel relation to metal board 20. A similar printed circuit board (not shown) may be installed on the other surface of metal board 20, such that the plurality of insulating containers 10 for holding electronic components therein are sandwiched between this printed circuit board and metal board 20.

Thin metal board 20 is made of a metal having a high thermal conductivity, such as aluminum. Tubes 21, made of copper pipes for example, are arranged in a zigzag manner inside metal board 20. Cooling water is circulated in tubes 21. Each insulating container 10 that accommodates electronic parts is firmly bonded to the surface of metal board 20 by silicone grease, for example. Each container 10 is mounted between metal board 20 and printed circuit board 30.

Figure 4:
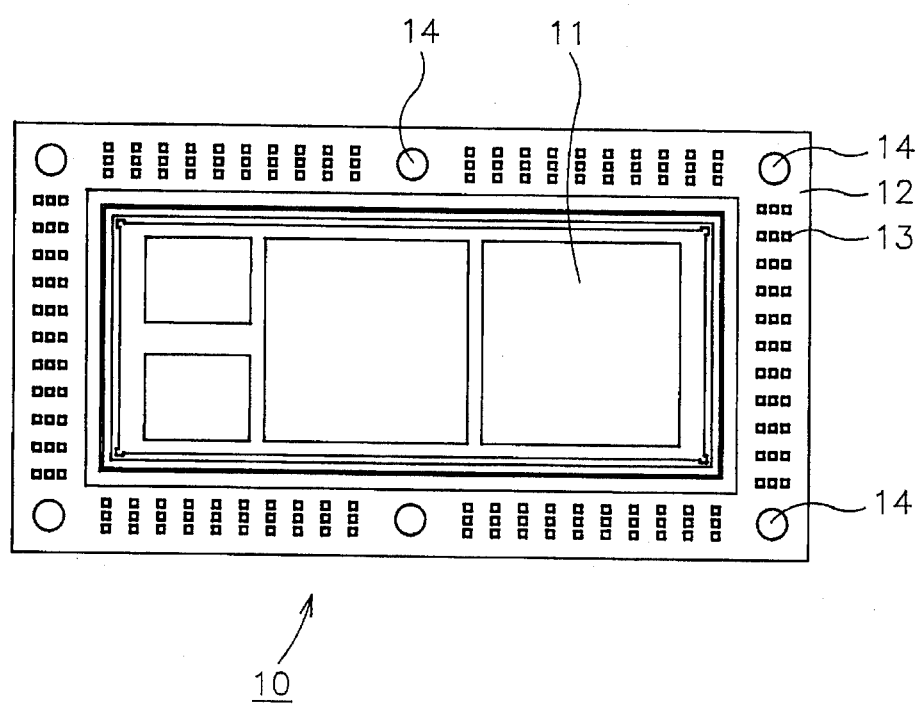
FIG. 4 is a plan view depicting an example of the insulating container 10 of FIG. 3.

FIG. 4 is a plan view showing one example of an insulating container 10. The container 10 is made, for example, of a ceramic. A plurality of electronic components 11, which generate heat, such as semiconductor chips, are arranged and held in container 10. A step portion 12 is formed on the surface of insulating container 10. A plurality of planar surface contact terminals 13 for electrically connecting the electronic components 11 with an external device (not shown), are arranged on step portion 12. Holes 14 extend through step portion 12. Surface contact terminals 13 are disposed on the opposite sides of holes 14. Security screws 70 are passed through the holes 14.

Returning to FIG. 3, the surface contact connectors are labeled 80. Each connector 80 is mounted between one surface contact terminal 13, mounted on insulating container 10, and surface contact terminal 31, mounted on printed circuit board 30. The connectors 80 electrically interconnect the surface contact terminals.

Figure 5:
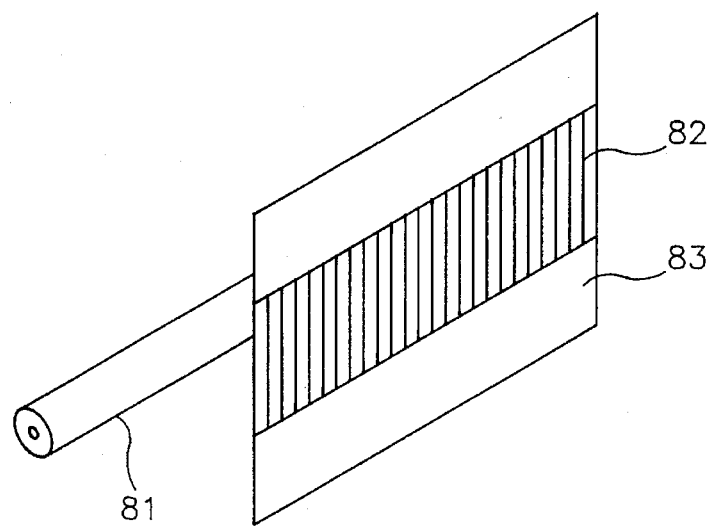
FIGS. 5A–5C are exploded perspective views depicting the assembly of a surface contact connector.
Figure 5:
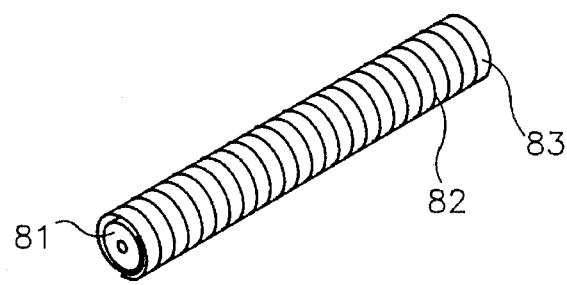
Figure 5:
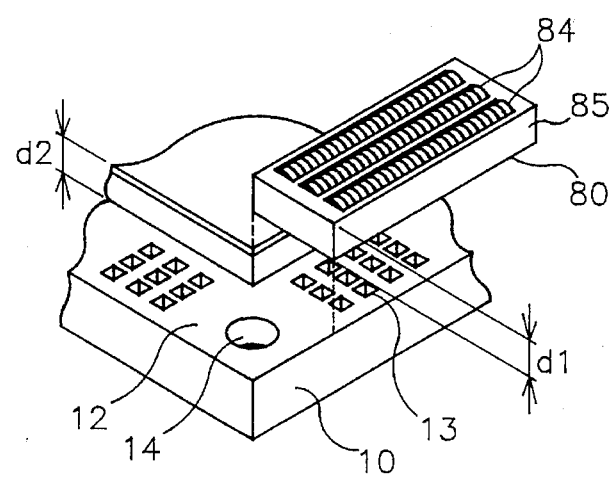

FIGS. 5A–5C are exploded perspective views showing of one example of a surface contact connector 80. Connector comprises a cylindrical core 81 made of a resilient material, an insulating thin film 83, and a frame 85. Thin film 83 has conductive contact patterns formed at a given pitch and wound around cylindrical core 81. Frame 85, is provided with holes 84 extending through the frame core 81, having the thin film thereon and similar cores are inserted in holes 84. The thickness d1 of frame 85 is substantially equal to or slightly larger than thickness d2 of the step portion formed around insulating container 10.

The surface contact connectors are assembled in the following manner. As shown in FIG. 5A, cylindrical core 81, made from a resilient material, such as silicone rubber, is first prepared. Conductive contact patterns 82, shown on the right side of core 81, are formed at a given pitch and constitute insulating thin film 83.

Then, as shown in FIG. 5B, insulating thin film 83 is wound into cylindrical core 81 that forms the main portion of the conductor.

Thereafter, as shown in FIG. 5C, the cylindrical cores, or the main portions of the connectors, are inserted into holes 84 extending through frame 85 in such a manner that conductive contact patterns 82 protrude, like convex portions, from both surfaces of frame 85. The insulating thin film is wrapped around each core. The thickness d1 of frame 85 is substantially equal to or slightly larger than the thickness d2 of step portion 12 formed around insulating container 10. Thus, if surface contact connectors 80 are positioned on step portion 12, which is formed around insulating container 10, only the convex portions of conductive contact patterns 82 protrude from frame 85.

Figure 6:
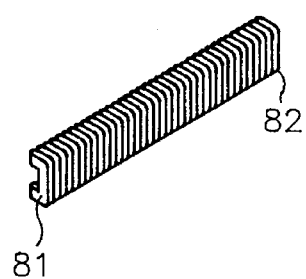
FIG. 6 is a perspective view depicting the core of another surface contact connector.

Each connector 80, constructed as above described, is mounted between step portion 12 on insulating container 10 and printed circuit board 30, or the surface contact terminals thereon. Printed circuit board 30 is firmly mounted to thin metal board 20. Under this condition, step portion 12 and the printed circuit board slightly press surface contact connectors 80. This ensures electrical connections between the surface contact terminals. Also, step portion 12 facilitates placing in position the surface contact connectors FIG. 6 is a perspective view of the main portion of another example of core 81. Core 81 is of a resilient material and has a U-shaped cross section. A conductive contact layer 82 is wound on the core at a give pitch and is firmly secured to the core. The core, constructed as depicted, is inserted into one of the holes extending through frame 85, as shown in FIG. 5C, so that the surface of the core is partially exposed. In this manner, the surface contact connector is fabricated.

Figure 7:
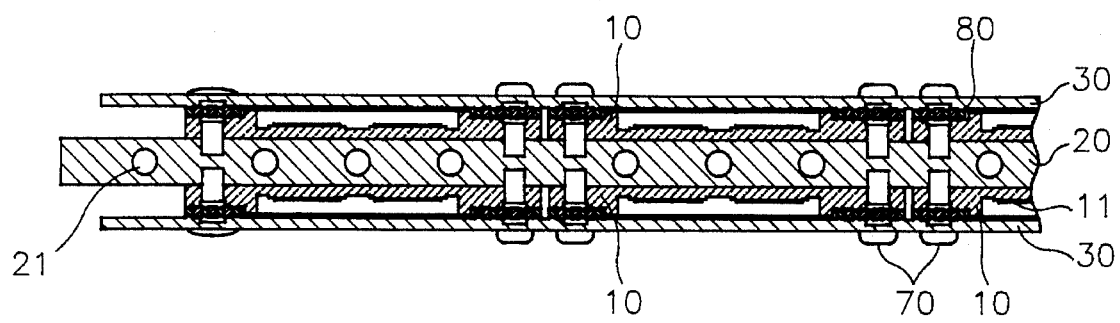
FIG. 7 is a cross sectional view depicting another illustrative embodiment of the invention.

FIG. 7 is a fragmentary cross section of an electronic circuit module comprising a thin metal board 20, a large number of insulating containers 10 arranged on both surfaces of metal board 20, and two printed circuit boards 30 disposed so as to extend parallel to the metal board 20. Each insulating container 10 holds electronic components therein and is sandwiched between one of the printed circuit boards 30 and the metal board 20.

Insulating containers 10, holding electronic components 11, are arranged on the surfaces of thin metal board 20 and is firmly secured thereto. Conductive interconnection means for interconnecting the electronic components so as to form a desired electronic circuit, terminal rows for making surface contacts, and etc., are formed on each printed circuit board 30, but are not shown herein as to the manner of construction. Each surface contact connector 80 is inserted between one surface contact terminal 13 mounted on step portion 12 on each insulating container 10 and the surface contact terminal row mounted on the side of printed circuit board 30.

Printed circuit board 30 is mounted on thin metal board 20 with insulating container 10 therebetween, while securing screws 70 are lightly pressing surface contact connectors 80 positioned on step portion 12.

Insulating containers 10 accommodate the components just described. The bottom surface of each container 10 is substantially rigidly fixed to metal board 20. Thus, heat generated by the electronic components 11 is effectively carried to metal board 20 via insulating container 10.

Then, the heat, carried to thin metal board 20, is transferred to the coolant flowing through tubes 21 positioned inside metal board 20. Thus, the heat is carried away to the outside. Accordingly, heat dissipation efficiency of the module is excellent.

The electrical connections of each electronic component with the printed circuit boards are made via surface contact connectors 80 having numerous surface contact portions. Accordingly, when components 11 and boards 30 are mounted to thin metal board 20, for assembly, a soldering operation, or the like, may be dispensed Thus, during assembly, the electronic components are advantageously prevented from being heated. This maintains the reliability of the components. Also, the positioning accuracy is substantially improved. In addition, advantageously, the thickness of the module in the thickness direction of the thin metal hoard is made considerably thin.

Although up to now the description is of the module being installed in the head of an LSI tester, the invention can be used for other purposes, such as in an aircraft which puts a premium weight and size. Also, in the above description, water supplied from the outside is used as the coolant circulated through pipes 21 position inside metal board 20. Instead, a plurality of heat pipes can be used. Also, in the examples discussed herein, covers are placed on the Insulating containers 10 after positioning the electronic components. Printed circuit boards 30 may be used as the covers. Furthermore, In the description, the components are disposed in insulating containers. The containers are mounted to a thin metal board through which cooling water or coolant is circulated. Terminals for making electrical connections with the electronic components are disposed on the surfaces of the containers. Electrical connections with the printed circuit boards are made via surface contact connectors. The invention, advantageously, facilitates connection with numerous electronic terminals, is easy to assemble, and is easy to maintain because it is easy to replace. Also, the invention advantageous in that it is small, in total thickness. Finally, the invention enjoys excellent heat dissipation characteristics.

The foregoing description is illustrative of the principles of the invention. Numerous extensions and modifications thereof would be apparent to the worker skilled in the art. All such extensions and modifications are to be considered to be within the and scope of the invention.

What is claimed is:

1. An electronic circuit module comprising a plurality of first terminals (13);

a plurality of second terminals (31);

an insulating container (10) having two surfaces with a depression in one of said two surfaces, said depression holding an electronic component therein, said plurality of first terminals being formed on one of said two surfaces of said insulating container and in electrical contact with said electronic component;

a metal board (20) having at least two surfaces and at least one hollow tube therein for passing a coolant therethrough, said insulating container being mounted on said metal board so that another of said two surfaces of said insulating container is in contact with said one of said two surfaces of said metal board;

a printed circuit board (30) having two surfaces and disposed on said insulating container so that one of said two surfaces of said printed circuit board is in contact with said one of said two surfaces of said insulating container and mounted in parallel to said metal board, said plurality of second terminals being formed on said one of said two surfaces of said printed circuit board and in electrical contact with said electronic component; and surface contact connectors (80) positioned between each of said plurality of first terminals and each of said plurality of second terminals to form an electrical contact therebetweeen;

whereby cooling is achieved without increased cooling surface area.

2. The module of claim 1, wherein said insulating container has outer surfaces which comprise step portions;

at least one plurality of said pluralities of first and second terminals being arranged on said step portions; and said surface contact connectors are disposed on said step portions.

3. The module of claim 2, wherein each of said surface contact connectors comprises a cylindrical core made of a resilient material, conductive contact patterns formed at a given pitch and wound on said cylindrical core, an insulating thin film having said conductive contact patterns, and a frame having holes extending therethrough, said cylindrical core being inserted in one of said holes, and wherein said frame has thickness substantially equal to or slightly larger than thickness of said step portions.

4. The module of claim 2, wherein each of said surface contact connectors comprises a core made of a resilient material and having a rectangular U-shaped cross section, a conductive contact layer wound at a regular pitch on said core and firmly secured to said core, and a frame having holes extending therethrough, and wherein said core is inserted in one of said holes in such a manner that a surface of said core is partially exposed.

* * * * *